(12) United States Patent
Lechuga et al.

(10) Patent No.: US 10,174,906 B2
(45) Date of Patent: Jan. 8, 2019

(54) LED LUMINAIRE TILING WITH A LENS ARRAY CONTAINING A PLURALITY OF LENSLETS

(71) Applicant: Fresnel Technologies, Inc., Ft. Worth, TX (US)

(72) Inventors: Oscar M. Lechuga, Aledo, TX (US); Richard N. Claytor, Arlington, TX (US)

(73) Assignee: Fresnel Technologies Inc., Fort Worth, TX (US)

( * ) Notice: Subject to any disclaimer, the term of this patent is extended or adjusted under 35 U.S.C. 154(b) by 308 days.

(21) Appl. No.: 13/921,193

(22) Filed: Jun. 18, 2013

(65) Prior Publication Data
US 2013/0335969 A1 Dec. 19, 2013

Related U.S. Application Data

(60) Provisional application No. 61/661,279, filed on Jun. 18, 2012.

(51) Int. Cl.
| | | |
|---|---|---|
| *F21V 5/00* | (2018.01) | |
| *H01L 27/146* | (2006.01) | |
| *F21Y 105/12* | (2016.01) | |
| *F21Y 105/10* | (2016.01) | |
| *F21Y 115/10* | (2016.01) | |

(52) U.S. Cl.
CPC ........ *F21V 5/007* (2013.01); *H01L 27/14627* (2013.01); *F21Y 2105/10* (2016.08); *F21Y 2105/12* (2016.08); *F21Y 2115/10* (2016.08)

(58) Field of Classification Search
CPC .... G02B 27/0961; G02B 3/0056; G02B 3/02; G02B 3/08; G02B 3/04; G02B 3/0037; G02B 3/0043; H01L 27/14627; F21V 5/007
See application file for complete search history.

(56) References Cited

U.S. PATENT DOCUMENTS

| | | | |
|---|---|---|---|
| 5,612,821 A | | 3/1997 | Schmutz |
| 6,101,040 A | * | 8/2000 | Itoh ................ G02B 3/0043 348/E9.027 |

(Continued)

FOREIGN PATENT DOCUMENTS

WO 01/09859 A1 2/2001

OTHER PUBLICATIONS

Bernet, Stefan and Ritsch-Marte, Monika, "Adjustable refractive power from diffractive moire elements"; Applied Optics, vol. 47, No. 21, Jul. 20, 2008; 9 pages.

(Continued)

*Primary Examiner* — Evan Dzierzynski
*Assistant Examiner* — Gerald J Sufleta, II
(74) *Attorney, Agent, or Firm* — John A. Fortkort; Fortkort & Houston PC

(57) ABSTRACT

A light source is provided which comprises an LED array containing a plurality of LEDs, and a lens array containing a plurality of lenslets. The lens array is aligned with the LED array such that one lenslet is disposed over each LED, wherein each of said plurality of lenslets comprises at least first and second sublenslets having first and second respective optical centers, and wherein at least one of said first and second optical centers deviates from the geometric center of the lenslet.

22 Claims, 6 Drawing Sheets

(56) References Cited

U.S. PATENT DOCUMENTS

| | | |
|---|---|---|
| 6,911,915 B2 | 6/2005 | Wu et al. |
| 7,034,343 B1 | 4/2006 | Kim et al. |
| 7,252,405 B2 | 8/2007 | Trenchard et al. |
| 7,300,177 B2 | 11/2007 | Conner |
| 7,400,439 B2 | 7/2008 | Holman |
| 7,559,672 B1 | 7/2009 | Parkyn et al. |
| 2004/0008392 A1 | 1/2004 | Kappel et al. |
| 2004/0156640 A1* | 8/2004 | Dress ............... G06E 3/006 398/140 |
| 2005/0174768 A1 | 8/2005 | Conner |
| 2006/0152931 A1 | 7/2006 | Holman |
| 2007/0002453 A1 | 1/2007 | Munro |
| 2008/0008472 A1 | 1/2008 | Dress et al. |
| 2008/0036972 A1 | 2/2008 | Phillips, III et al. |
| 2008/0298057 A1 | 12/2008 | Scordino et al. |
| 2008/0310151 A1 | 12/2008 | Hoelen et al. |
| 2009/0002985 A1 | 1/2009 | Peck et al. |
| 2009/0079987 A1 | 3/2009 | Ben-Ezra et al. |
| 2009/0092366 A1 | 4/2009 | Iwasaki |
| 2009/0103296 A1 | 4/2009 | Harbers et al. |
| 2009/0116225 A1 | 5/2009 | Feinbloom et al. |
| 2009/0135623 A1 | 5/2009 | Kunimochi |
| 2009/0153974 A1 | 6/2009 | Sales |
| 2009/0161361 A1 | 6/2009 | Meir et al. |
| 2009/0168414 A1 | 7/2009 | Bailey |
| 2009/0212707 A1 | 8/2009 | Stevn |
| 2009/0219716 A1 | 9/2009 | Weaver et al. |
| 2009/0236497 A1 | 9/2009 | Baxter |
| 2011/0267813 A1* | 11/2011 | Kubota ............... F21V 5/002 362/235 |
| 2012/0199852 A1* | 8/2012 | Lowes et al. ............... 257/88 |
| 2013/0215596 A1* | 8/2013 | Holman ............... G03B 15/05 362/84 |

OTHER PUBLICATIONS

Dross, Oliver et al., "Illumination Optics:Kohler integration optics improve illumination homogeneity"; Laser Focus World, www.laserfocusworld.com/articles/359814; Oct. 8, 2009; 6 pages.

White paper; "Secondary Optics Design Considerations for SuperFlux LEDs"; Lumileds Lighting, LLC; Application Brief AB20-5 (replaces AN1149-5); 2002; 23 pages.

Tian, Kehan and Barbastathis, George; "Coherence patterns originating from incoherent volume sources"; Optical Society of America; Optics Letters, vol. 29, No. 7, Apr. 1, 2004; 3 pages.

White paper, ERCO Eclipse for 3-circuit track; ERCO Lighting Ltd., www.erco.com; Jan. 13, 2003; 6 pages.

Schreiber, Peter et al., "Homogeneous LED-illumination using microlens arrays", Fraunhofer Institute for Applied Optics and Precision Mechanics, Jena, Germany; 9 pages.

O'Neill, M.J. et al., "Ultra-light stretched Fresnel lens solar concentrator for space power applications", SPIE's 48th Annual Meeting, San Diego, Aug. 3-8, 2003; Paper No. 5179-17; 11 pages.

* cited by examiner

LED LUMINAIRE TILING WITH A LENS ARRAY CONTAINING A PLURALITY OF LENSLETS

CROSS-REFERENCE TO RELATED APPLICATION

This application claims the benefit of U.S. provisional application No. 61/661,279, filed Jun. 18, 2012, having the same title, and having the same inventors, and which is incorporated herein by reference in its entirety.

FIELD OF THE DISCLOSURE

The present disclosure pertains to methods for arranging lenses so as to spread light optimally from an array of LEDs to an area to be illuminated, and to systems made in accordance with such methods.

BACKGROUND OF THE DISCLOSURE

Various light sources based on LED arrays are currently known to the art. At present, it is common to provide each LED in the array with non-imaging optics based on total internal reflection. Such optics, which are commonly referred to as compound parabolic collectors (CPCs), are typically either placed individually over each LED or are molded into the array with the same spacing as the LEDs. Although they are optically efficient, these non-imaging optics are thick and expensive to produce, and do not necessarily direct light to the proper locations for a desirable illumination pattern.

Alternatively, some LED luminaries use arrays of lenses. Typically, each lens in the array is ahead of each LED, and has its optical center centered on the LED. Such luminaries produce a pattern in the illuminated area which is strongest directly in front of the luminaire, and which is not uniform over the illuminated area.

SUMMARY OF THE INVENTION

In one aspect, a light source is provided which comprises an LED array containing a plurality of LEDs, and a lens array containing a plurality of lenslets. The lens array is aligned with the LED array such that one lenslet is disposed over each LED, wherein each of said plurality of lenslets comprises at least first and second sublenslets having first and second respective optical centers, and wherein at least one of said first and second optical centers deviates from the geometric center of the lenslet.

DETAILED DESCRIPTION

Figure 1:
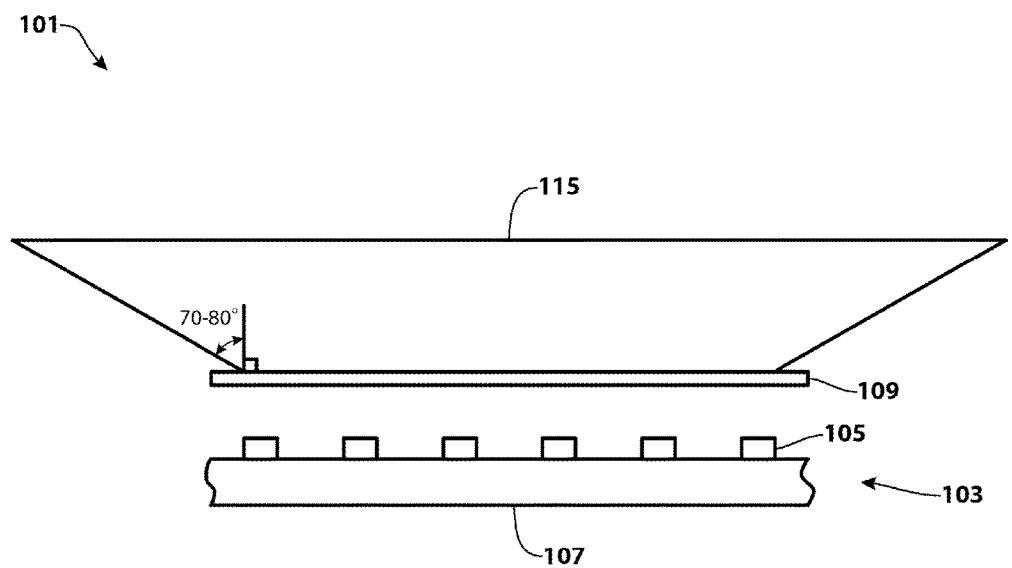
FIG. 1 is an illustration of a prior art LED illumination device containing an LED array and an optical element, and depicting the optical footprint of the device.

FIG. 1 is an illustration of a prior art LED illumination device containing an LED array and an optical element, and depicting the optical footprint of the device. With reference thereto, the manufacturing and application constraints for such a device often require that the luminaire 101 be designed with an LED array 103 consisting of multiple LEDs 105 attached to a flat circuit board 107. These constraints also require that the associated optics (which, in the case depicted, is a lens array 111) spreads light reasonably uniformly across the illuminated area 115 over angles as large as 70° to 80° from an axis which is perpendicular to the circuit board 107.

Figure 2:
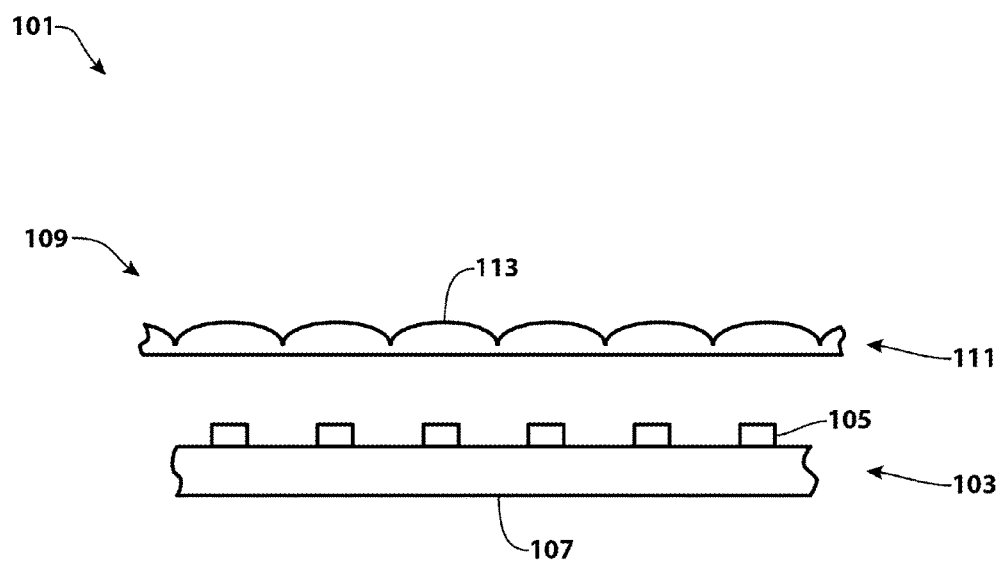
FIG. 2 is an illustration of a prior art LED illumination device containing an LED array and an optical element, and depicting some of the details of the optical element.

As shown in FIG. 2, this light spreading may be most economically achieved with a lens array 111 consisting of multiple lenslets 113 which are molded or otherwise formed in a sheet of plastic or glass, and which are placed parallel to, and in the proximity of, the plane of the LEDs 105. Typically, there will be as many lenslets 113 in the lens array 111 as there are LEDs 105 in the LED array 103, and the dimensions of each lenslet 113 in the plane of the lens array 111 will be equal to the spacings between LEDs 105.

It is generally preferred that a smooth, or substantially smooth, surface be presented to the illuminated area. In order to avoid the complexity, expense, and light loss of an additional layer of plastic or glass, the refractive surfaces 117 of the lenslets 113 must therefore face the LEDs 105, and the lenslets 113 must therefore be plano-convex, or substantially plano-convex. The smooth, or substantially smooth, outer surface 119 of the sheet of plastic or glass may be planar or prismatic, or may be curved as a pillow, a saddle, a portion of a cylinder or cone, or in various other ways. In some embodiments, the outer surface 119 may be equipped with a diffuser to spread the image of each LED 103 a few degrees so as to improve the evenness of the illumination in the illuminated area 115.

LEDs generally emit over angles as large as 120° to 180°. In order to capture all, or most, of the emitted light, the lenslets 113 must be large in extent compared to their focal length (that is, they must be "fast" lenslets). The LED-to-LED spacing on the circuit board 107 dictates the area available for the optics associated with each LED 103. The spacing d between the plane of the lens array 111 and the plane of the LEDs 105 is typically less than the LED-to-LED spacing, and may be half of it. Stylistic considerations usually further reduce the spacing between the lens array 111 and the plane of the LED array 105.

To date, some success has been achieved in this type of configuration with LED light sources which use aspheric lenses (and in particular, aspheric Fresnel lenses which are made correct for conjugates of the focal length and infinity) with the focal length on the plano side, but positioned with the LED on the grooved side. Such a configuration permits the use of a master which is made for, or is useful in, other applications. Unfortunately, total internal reflection in this type of configuration limits the aperture to approximately f/1, which is inadequate to capture and redirect a desirable portion of the light.

Figure 3:
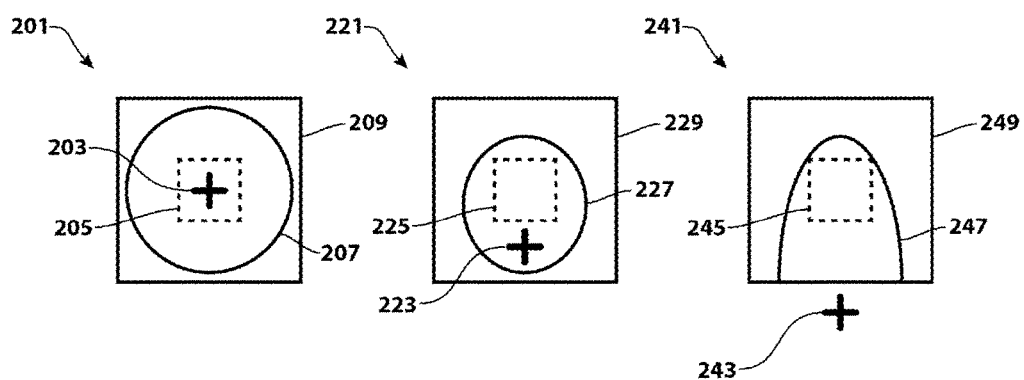
FIGS. 3-6 depict some possible configurations for the illuminated area of each lenslet in the lens array of an LED illumination device and with the LEDs partially illuminated.

This situation may be visualized by observing the illuminated area of each lenslet in the lens array with the LEDs partially illuminated. FIG. 3 shows several possibilities for such a configuration. In the first configuration 201, the optical center 203 of the lenslet is centered on the emitting area 205 of the lenslet, the illuminated area 207 of the lenslet, and the area available 209 for the lenslet. In the second configuration 221, the optical center 223 of the lenslet is outside of the emitting area 225 of the lenslet but within (though off-center of) the illuminated area 227 of the lenslet and the area available 229 for the lenslet. In the third configuration 241, the optical center 243 of the lenslet is outside of the emitting area 245 of the lenslet, and is also outside of the illuminated area 247 of the lenslet and the area available 249 for the lenslet.

Figure 4:
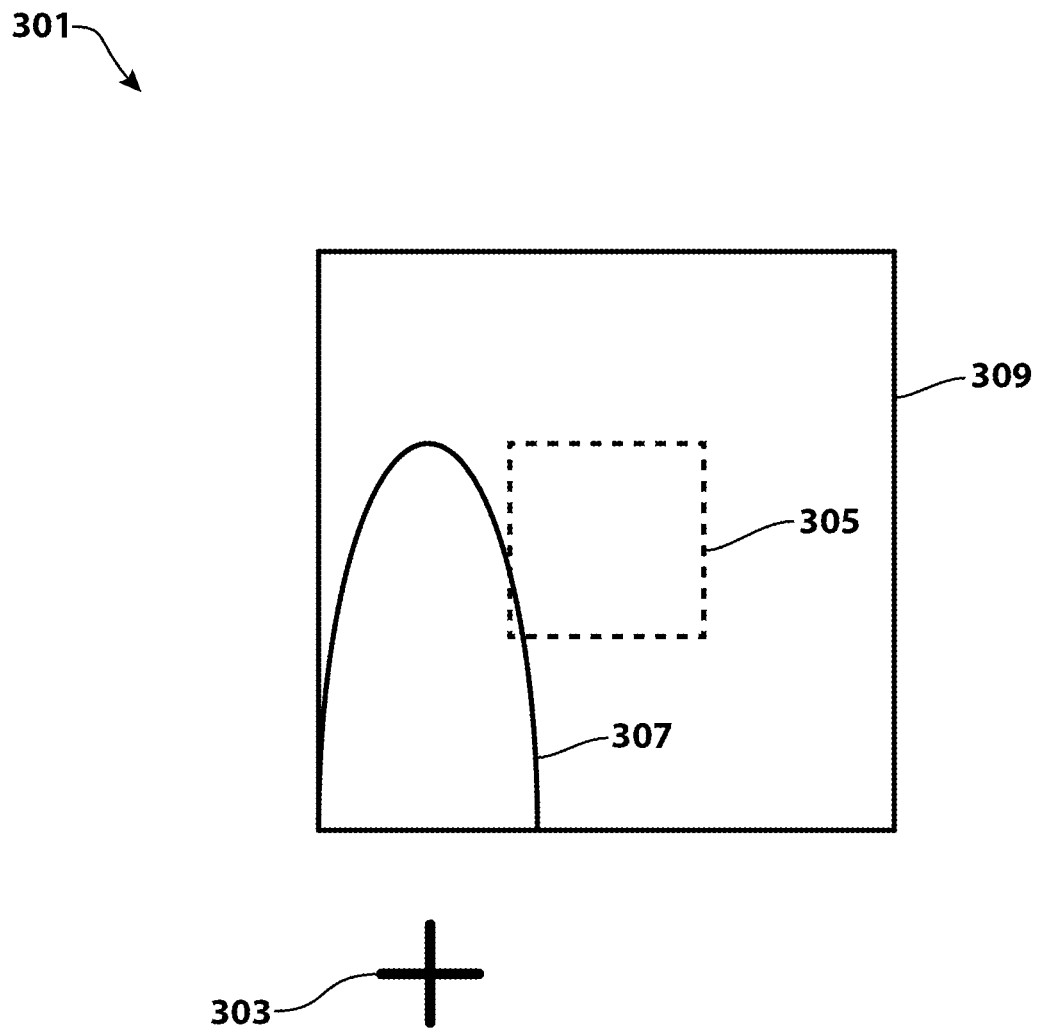

FIG. 4 illustrates the situation obtained when light is sent to a far corner of the pattern. As seen therein, in such a configuration 301, the optical center 303 of the lenslet is outside of the emitting area 305 of the lenslet, and is also outside of the illuminated area 307 of the lenslet and the area available 309 for the lenslet. Of course, and in contrast to the configuration 241 of FIG. 3, the illuminated area 307 in the configuration 301 of FIG. 4 is shifted to the corner of the area available 309 for the lenslet.

The configuration 301 of FIG. 4 typically produces an illuminated area 307 or bright area on the lenslet. This illuminated area 307 can be visualized by intercepting the rays headed for the area to be illuminated with the eye, and noting the size and shape of the bright area. This illuminated area 307 covers only about one quarter of the area of a lenslet in the lens array. Consequently, the remaining dark area can be used to illuminate other areas of the pattern, such as the center, but these areas are usually well enough illuminated by scatter from the vertical surfaces of the Fresnel lenses and cross illumination by adjacent LEDs. Moreover, sending light to the far corners of the area to be illuminated may require that the lenses forming the lenslets be as fast as f/0.3, because they will need to be used very far off axis. Such a lens will have very steep groove angles (sharp grooves with angular extent of 75° or so).

Figure 5:
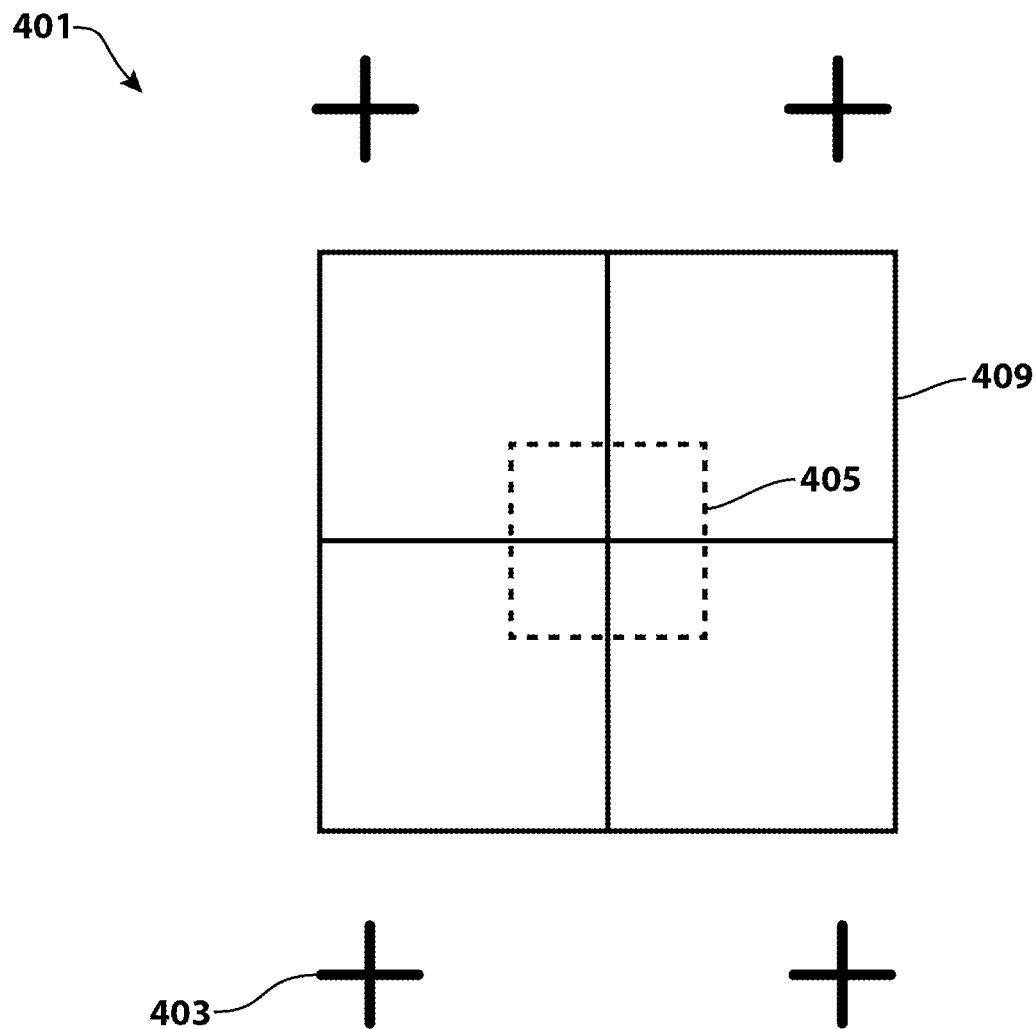

More profitably, configurations may be utilized in which the dark areas are used to send light to the remaining three far corners of the pattern. FIG. 5 illustrates a particular, non-limiting embodiment of a configuration in accordance with the teachings herein which has been constructed using such an approach. This approach typically results in a configuration 401 which typically has double mirror symmetry, with each lenslet in the array comprising four sublenslets. The emitting area 405 in this embodiment is centered on the lenslet, and the optical centers 403 of the sublenslets are outside of the area available 409 for the lenslet. The configuration 401 of FIG. 5 will produce a bilaterally or quadralaterally symmetric pattern in the illuminated area, assuming that the plane of the LEDs is parallel to the plane of the illuminated area (as well as to the plane of the lens array, of course).

It will be appreciated that various luminaires may be produced which have a configuration the same as, or similar to, the configuration of FIG. 5. The specific design of these configurations will depend, for example, on the desired pattern in the illuminated area. However, the general method of producing these configurations remains the same. In particular, the useful area of the lenslet is determined by noting the bright or illuminated area as seen from the direction being illuminated, and the dark area is utilized to send light in other directions in which it is needed by dividing the lenslet into two or more sublenslets.

Figure 6:
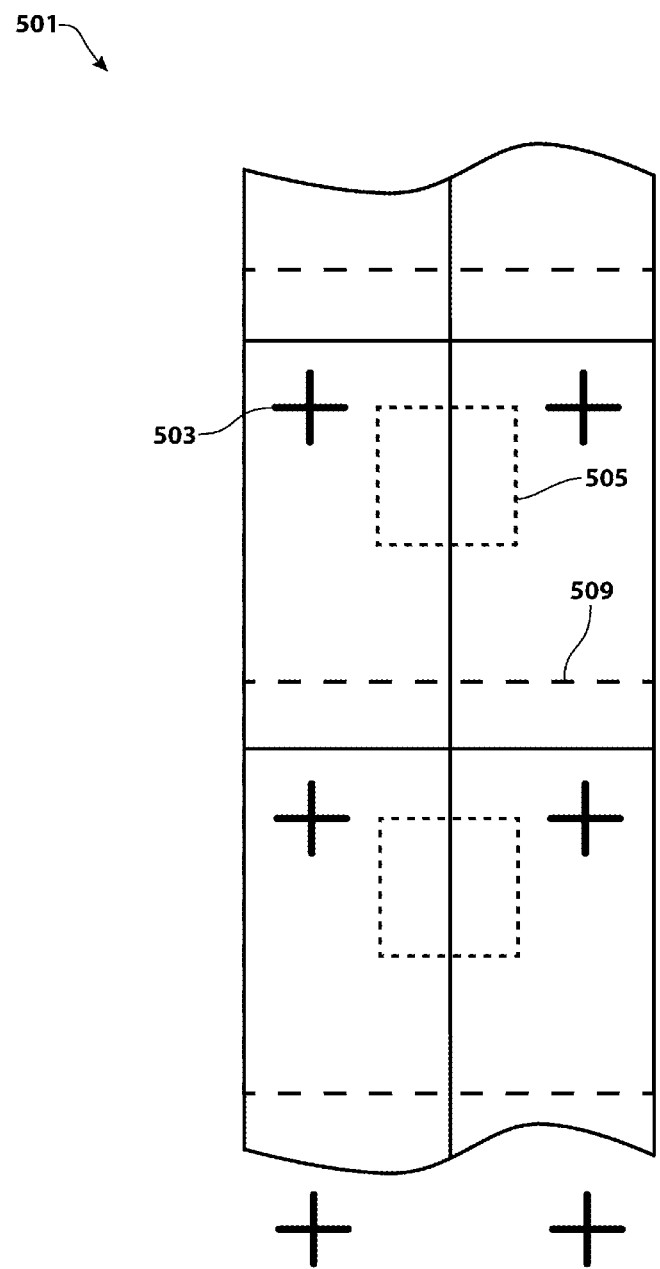

FIG. 6 shows another particular, non-limiting example of a configuration for an LED illumination device made in accordance with the foregoing approach. In the particular embodiment depicted, the configuration 501 features a plurality of lenslets, each of which comprises a plurality of sublenslets. The optical centers 503 of the sublenslets are outside of the emitting areas 505 of the lenslets. The limit of the area available 509 for the lenslets is indicated by dashed lines.

The embodiment of FIG. 6 demonstrates that the area of one lenslet associated with one LED can be intruded upon by an extended portion of a lenslet associated with an adjacent LED. By this method, the illumination level in the illuminated area can be increased, typically between a factor of two and a factor of four.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A light source, comprising:
an LED array containing a plurality of LEDs; and
a lens array containing a plurality of lenslets;
wherein the lens array is aligned with the LED array such that one lenslet is disposed over each LED in said LED array, wherein each of said plurality of lenslets comprises at least first and second sublenslets having first and second respective optical centers, and wherein at least one of said first and second optical centers deviates from a geometric center of the lenslet; and
wherein each of said first and second optical centers is a point on an axis of the corresponding sublenslet at which any ray of light passing through either the first or second optical center suffers no net deviation.

2. The light source of claim 1, wherein both of said first and second optical centers deviate from the geometric center of the lenslet.

3. The light source of claim 1, wherein each of said plurality of lenslets further comprises third and fourth sublenslets having third and fourth respective optical centers, and wherein at least the first, second and third optical centers deviate from the geometric center of the lenslet, and wherein each of said third and fourth optical centers is a point on the axis of the corresponding sublenslet at which any ray of light passing through it suffers no net deviation.

4. The light source of claim 3, wherein at least one of said first, second, third and fourth optical centers falls outside of a geometric boundary of said lenslet.

5. The light source of claim 3, wherein each of said first, second, third and fourth optical centers falls outside of a geometric boundary of said lenslet.

6. The light source of claim 1, wherein each of said plurality of lenslets further comprises third and fourth sublenslets having third and fourth respective optical centers, wherein each lenslet is disposed over an LED, wherein each of said third and fourth optical centers is a point on the axis of the corresponding sublenslet at which any ray of light passing through either the third, fourth, or both optical centers suffers no net deviation, and wherein none of said first, second, third and fourth optical centers is disposed over said LED.

7. The light source of claim 6, wherein each of said plurality of lenslets is geometrically centered over one of said LEDs.

8. The light source of claim 1, wherein each of said plurality of lenslets is geometrically centered over one of said LEDs, and wherein said first and second sublenslets direct light from the same LED in first and second different directions.

9. The light source of claim 1, wherein said LED array emits light of visible wavelengths.

10. The light source of claim 1, wherein each lenslet has double mirror symmetry.

11. The light source of claim 1, wherein the LED array creates an illuminated area, and wherein the lenslet array produces a bilaterally or quadrilaterally symmetric pattern in the illuminated area.

12. The light source of claim 11, wherein the LED array is planar, and wherein a plane of the LED array is parallel to the plane of the illuminated area.

13. The light source of claim 1, wherein each lenslet is plano-convex.

14. The light source of claim 1, wherein each lenslet is an aspheric lens.

15. The light source of claim 1, wherein each lenslet is an aspheric Fresnel lens which is correct for conjugates of a focal length and infinity.

16. The light source of claim 15, wherein each lenslet is configured with the focal length on the plano side, and with a grooved side facing the LED array.

17. The light source of claim 1, wherein each of said plurality of lenslets further comprises third and fourth sublenslets having third and fourth respective optical centers, wherein each of said third and fourth optical centers is a point on the axis of the corresponding sublenslet at which any ray of light passing through either the third or fourth optical centers suffers no net deviation, and wherein at least the first, second and third optical centers are located outside of a light emitting region border of the LED that the lenslet is disposed over but are not located outside of a geometric boundary of the lenslet.

18. The light source of claim 17, wherein at least one of said first, second, third and fourth optical centers falls outside of the geometric boundary of said lenslet.

19. The light source of claim 1, wherein each lenslet is disposed over exactly one LED.

20. The light source of claim 19, wherein a number of lenslets in said lens array is equal to a number of LEDs in said LED array.

21. A light source, comprising:
an LED array containing a plurality of LEDs; and
a lens array containing a plurality of lenslets, wherein each lenslet is an aspheric lens;
wherein the lens array is aligned with the LED array such that one lenslet is disposed over each LED in said LED array, wherein each of said plurality of lenslets comprises at least first and second sublenslets having first and second respective optical centers, and wherein at least one of said first and second optical centers deviates from a geometric center of the lenslet; and
wherein each of said first and second optical centers is a point on an axis of the corresponding sublenslet at which any ray of light passing through either the first or second optical centers suffers no net deviation.

22. The light source of claim 21, wherein each lenslet is an aspheric Fresnel lens which is correct for conjugates of a focal length and infinity.

* * * * *